(12) United States Patent
Hiramatsu et al.

(10) Patent No.: US 10,020,427 B2
(45) Date of Patent: Jul. 10, 2018

(54) PHOSPHOR, MANUFACTURING METHOD THEREFOR, AND LIGHT-EMITTING DEVICE USING THE PHOSPHOR

(71) Applicants: KABUSHIKI KAISHA TOSHIBA, Tokyo (JP); TOSHIBA MATERIALS CO., LTD., Yokohama-shi (JP)

(72) Inventors: Ryosuke Hiramatsu, Yokohama (JP); Keiko Albessard, Yokohama (JP); Naotoshi Matsuda, Chigasaki (JP); Masahiro Kato, Naka (JP)

(73) Assignees: KABUSHIKI KAISHA TOSHIBA, Tokyo (JP); TOSHIBA MATERIALS CO., LTD., Yokohama-shi (JP)

( * ) Notice: Subject to any disclaimer, the term of this patent is extended or adjusted under 35 U.S.C. 154(b) by 0 days.

(21) Appl. No.: 14/849,103

(22) Filed: Sep. 9, 2015

(65) Prior Publication Data

US 2015/0380614 A1  Dec. 31, 2015

Related U.S. Application Data

(63) Continuation of application No. PCT/JP2014/054076, filed on Feb. 20, 2014.

(30) Foreign Application Priority Data

Mar. 13, 2013 (JP) ................... 2013-050584

(51) Int. Cl.
    *H01L 33/50*  (2010.01)
    *C09K 11/61*  (2006.01)
    *H01L 23/00*  (2006.01)

(52) U.S. Cl.
    CPC .......... *H01L 33/504* (2013.01); *C09K 11/617* (2013.01); *H01L 24/73* (2013.01);
    (Continued)

(58) Field of Classification Search
    CPC ........................ H01L 33/502; H01L 33/504
    See application file for complete search history.

(56) References Cited

U.S. PATENT DOCUMENTS

| 8,491,816 B2 | 7/2013 | Hong et al. |
| 2012/0032219 A1* | 2/2012 | Ooyabu ............. B82Y 30/00 257/98 |

(Continued)

FOREIGN PATENT DOCUMENTS

| CN | 101939857 A | 1/2011 |
| JP | 2011-012091 | 1/2011 |

(Continued)

OTHER PUBLICATIONS

Takahashi, "Synthesis of K2SiF6:Mn4+ Red Phosphor from silica Glasses by wet Chemical Etching in HF/KMnO4 Solution," 2009, Electrochemical and solid state Letters,12 (8), J69-J71.*

(Continued)

*Primary Examiner* — Michael Carter
(74) *Attorney, Agent, or Firm* — Oblon, McClelland, Maier & Neustadt, L.L.P.

(57) ABSTRACT

The present invention provides a red-light emitting phosphor that exhibits high luminous efficacy and emits light when excited by light having an emission peak in the blue region; and a method for manufacturing said phosphor. The phosphor represented by general formula (A): $_a(Si_{1-x-y},Ti_x,Mn_y)F_b$ and also characterized in that the half-band width of a diffraction pattern attributed to the (400) plane is not less than 0.2° determined by X-ray powder diffractometry. This phosphor can be manufactured by preparing a reaction solution consisting of an aqueous solution containing potassium permanganate and hydrogen fluoride, immersing a silicon source in said reaction solution, and reacting them for 20 to 80 minutes.

16 Claims, 4 Drawing Sheets

(52) U.S. Cl.
CPC .. *H01L 33/502* (2013.01); *H01L 2224/16145* (2013.01); *H01L 2224/32245* (2013.01); *H01L 2224/32257* (2013.01); *H01L 2224/48091* (2013.01); *H01L 2224/48247* (2013.01); *H01L 2224/48465* (2013.01); *H01L 2224/49107* (2013.01); *H01L 2224/73265* (2013.01); *H01L 2924/181* (2013.01)

(56) References Cited

U.S. PATENT DOCUMENTS

| | | | |
|---|---|---|---|
| 2012/0075549 A1* | 3/2012 | Lin | C09K 11/7792 349/61 |
| 2013/0082289 A1 | 4/2013 | Sakuta et al. | |
| 2015/0076406 A1* | 3/2015 | Zhou | C09K 11/576 252/301.4 F |

FOREIGN PATENT DOCUMENTS

| | | |
|---|---|---|
| JP | 2013-012711 | 1/2013 |
| JP | 2013-189588 | 9/2013 |
| TW | 2010-209311 | 9/2010 |
| WO | WO 2007-100824 | 9/2007 |
| WO | WO 2009-119486 | 10/2009 |

OTHER PUBLICATIONS

Office Action dated Jul. 23, 2015 in Taiwanese Application No. 103105649 (with English translation).
Office Action dated Nov. 25, 2014 in Taiwanese Application No. 103105649 (with English translation).
International Search Report dated Apr. 8, 2014 in PCT/JP2014/054076 filed Feb. 20, 2014.
Toru Takahashi et al. "Synthesis of K2SiF6:Mn4+ Red Phosphor from Silica Glasses by Wet Chemical Etching in HF/KMnO4 Solution" Electrochemical and Solid-State Letters, 12 (8) J69-J71 (2009).
Sadao Adachi et al. "Direct synthesis and properties of K2SiF6:Mn4+ phosphor by wet chemical etching of Si wafer" Journal of Applied Physics 104, 023512 (2008).
Toru Takahashi, et al., "Synthesis of K2SiF6:Mn4+ Red Phosphor from Silica Glasses by Wet Chemical Etching in HF/KMnO4 Solution", published in Electrochemical and Solid-State Letters, 12 (8), pp. J69-J71, published in Japan on Jun. 5, 2009.†

\* cited by examiner
† cited by third party

PHOSPHOR, MANUFACTURING METHOD THEREFOR, AND LIGHT-EMITTING DEVICE USING THE PHOSPHOR

CROSS-REFERENCE TO RELATED APPLICATIONS

This application is based upon and claims the benefit of priorities from the Japanese Patent Application No. 2013-050584, filed on Mar. 13, 2013, and the International Patent Application No. PCT/JP2014/054076, filed on Feb. 20, 2014, the entire contents of which are incorporated herein by reference.

FIELD

The present disclosure relates to a phosphor, a method for manufacturing the phosphor, and a light-emitting device using the phosphor.

BACKGROUND

An LED light-emitting device mainly comprises a combination of a phosphor and an LED chip serving as an excitation light source, and can realize various colors of emission light according to the combination.

Specifically, a white LED light-emitting device, which radiates white emission light, comprises a phosphor in combination with an LED chip that emits light in the blue region. For example, the device comprises a phosphor mixture and an LED chip giving off blue light. In practice, a phosphor emitting yellow light, which is complementary to blue light, is often adopted as the phosphor to produce a pseudo-white LED light-emitting device. Further, a three-wavelength white LED device is also developed which comprises an LED chip emitting blue light, a green- or yellow-light emitting phosphor and a red-light emitting phosphor.

As an example of the red-light emitting phosphor, $K_2SiF_6$:Mn phosphor is known. The phosphors used in the white LED light-emitting device are required to sufficiently absorb light radiated from the LED chip serving as an excitation light source and also to emit visible light highly efficiently. In addition, if used for illumination, the white LED device preferably comprises two or more kinds of the phosphors in view of color rendering properties, which determine apparent colors of illuminated objects.

DETAILED DESCRIPTION

Figure 1:
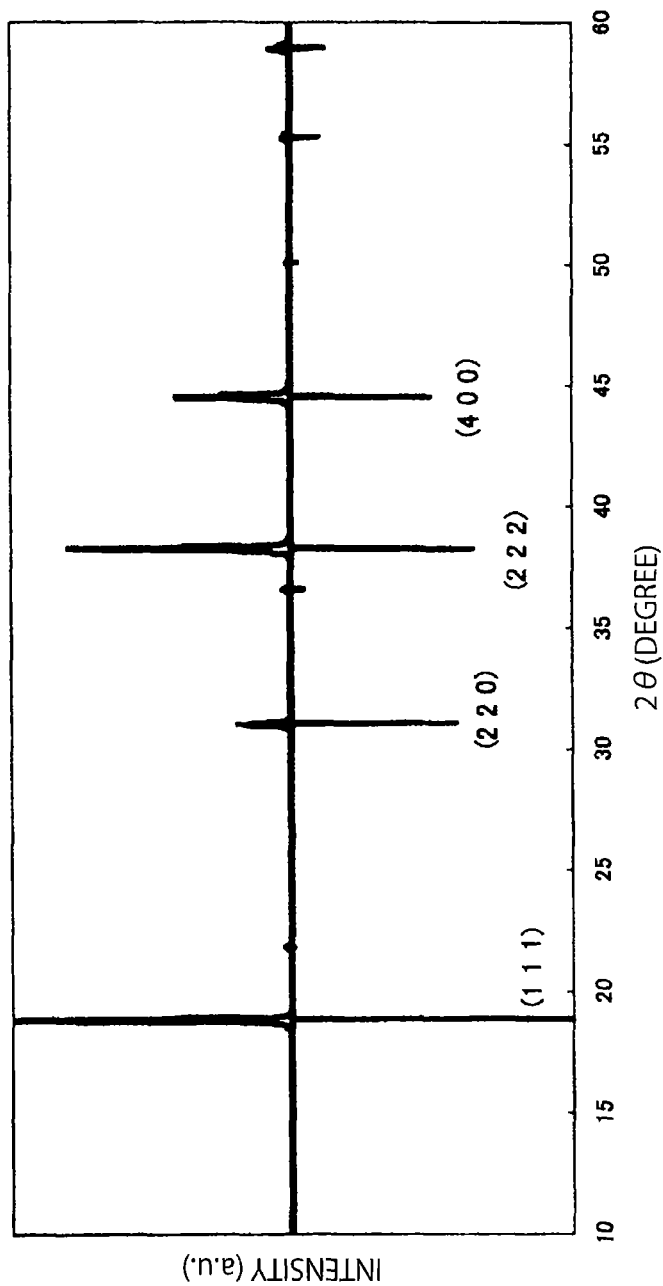
FIG. 1 shows XRD diffraction patterns of PDF#01-075-0694 and a phosphor according to an embodiment.

The phosphor according to an embodiment of the present disclosure is characterized by consisting of a compound having a composition that can be represented by the general formula (A):

$$K_a(Si_{1-x-y},Ti_x,Mn_y)F_b \quad (A)$$

in which a, b, x and y are numbers satisfying the conditions of $1.8 \leq a \leq 2.2$,
$5.2 \leq b \leq 6.3$
$0 \leq x \leq 0.3$, and
$0 < y \leq 0.06$;

and is also characterized in that the half-band width of a diffraction pattern attributed to the (400) plane is not less than 0.2° determined by X-ray powder diffractometry.

Further, the method according to another embodiment of the present disclosure for manufacturing the above phosphor comprises the steps of preparing a reaction solution consisting of an aqueous solution containing potassium permanganate and hydrogen fluoride, immersing a silicon source in said reaction solution, and reacting them for 20 to 80 minutes.

Furthermore, the light-emitting device according to still another embodiment of the present disclosure comprises a light-emitting element radiating light in the wavelength range of 440 to 470 nm inclusive, and a phosphor layer containing the above phosphor.

Embodiments of the present disclosure will now be explained below. However, it is noted that the embodiments described below are provided only to illustrate phosphors or light-emitting devices embodying the technical concept of the present disclosure, and hence the present disclosure is by no means limited to the following examples.

Further, this specification is not intended to restrict the members or elements mentioned in the claims to the described embodiments. In particular, the sizes, materials, shapes, arrangement and the like of the components described in the embodiments are intended not to limit the scope of the present disclosure but to provide merely illustrative examples. Incidentally, the sizes and positional relationship of the members shown in the drawings may be exaggerated for the purpose of clarifying the explanation. The same names or same reference numbers in the drawings indicate the same or equivalent members or elements, and hence detailed description thereof will be omitted. Some of the element constituting the present embodiments may be so integrated into one member that the member may function as the plural elements, and on the contrary some members may share the function of one element.

The applicant has intensively researched and studied phosphors mainly comprising potassium fluorosilicate activated by manganese, and finally found that there is a relation between the external quantum efficiency of the phosphor and the half-band width of a diffraction pattern thereof obtained by X-ray powder diffractometry (hereinafter often referred to as "XRD").

The red-light emitting phosphor according to the embodiment comprises potassium fluorosilicate activated by manganese as a major ingredient, and is represented by the following formula (A): $K_a(Si_{1-x-y},Ti_x,Mn_y)F_b$ (A).

In the formula, a, b, x and y are numbers satisfying the conditions of $1.8 \leq a \leq 2.2$, preferably $1.9 \leq a \leq 2.1$,
$5.2 \leq b \leq 6.3$, preferably $5.7 \leq b \leq 6.1$,
$0 \leq x \leq 0.3$, preferably $0 \leq x \leq 0.2$, and
$0 < y \leq 0.06$, preferably $0.01 \leq y \leq 0.05$.

Further, the phosphor is also characterized in that the half-band width of a diffraction pattern attributed to the (400) plane is not less than 0.20°, preferably 0.15°, determined by the XRD measurement.

The values of a and b need to be in the above ranges so that the phosphor can exhibit excellent luminous efficacy.

The phosphor according to the embodiment contains manganese as the activator. If not containing manganese (namely, in the case of y=0), the phosphor cannot be observed to emit luminescence even when excited by light having an emission peak in the blue to UV region. Accordingly, y in the formula (A) must be larger than 0. Further, y is preferably 0.01 or more because the luminous efficacy tends to be improved according as the manganese content increases. In addition, the valence of manganese is preferably +4 so as to obtain a phosphor emitting red luminescence.

On the other hand, however, if the manganese content is too high, the emission intensity of the phosphor tends to be lowered because of concentration quenching. The manganese content (y) is hence necessarily 0.06 or less, preferably 0.05 or less to avoid the quenching.

The phosphor according to the embodiment mainly comprises potassium fluorosilicate, but the silicon contained therein may be partially replaced with titanium. However, if the titanium content is too high, namely, if the value of x is too large, the phosphor cannot keep the crystal structure represented by $K_2SiF_6$ and accordingly shows different luminous properties. The value of x is therefore necessarily 0.3 or less and preferably satisfies the condition of $0 \leq x \leq 0.2$ so that the phosphor of the embodiment can have the emission wavelength similar to that of $K_2SiF_6$. Whether or not the phosphor has the same crystal structure as $K_2SiF_6$ can be determined by X-ray powder diffractometry in which the XRD profile of the phosphor is measured and compared with #01-075-0694 of the PDF (powder diffraction file) database to check whether or not they correspond to each other.

The content of each element in the phosphor can be analyzed, for example, in the following manner. For analyzing the metal elements such as K, Si, Ti and Mn, the synthesized phosphor is subjected to alkali fusion and then analyzed according to ICP emission spectroscopy by means of, for example, IRIS Advantage ICP spectrometer ([trademark], manufactured by Thermo Fisher Scientific Inc.). For analyzing the non-metal element F, the synthesized phosphor is subjected to thermal hydrolysis and then analyzed by means of, for example, DX-120 ion chromatograph system ([trademark], manufactured by Nippon Dionex K.K.). However, the element F can be analyzed by ion chromatography after the alkali fusion procedure is carried out in the same manner as the above metal elements.

Although stoichiometrically containing no oxygen, the phosphor according to the embodiment is often inevitably contaminated with oxygen by decomposition of the surface during or after the synthesizing process thereof. The oxygen content in the phosphor is ideally equal to zero, but in practice preferably satisfies the condition of:

[oxygen content]/[(fluorine content)+(oxygen content)]<0.05 because the luminous efficacy is not seriously lowered under that condition.

Further, the phosphor of the embodiment may contain alkali metals, such as Na, Rb and Cs, and other elements, such as Ge and Sn, in small amounts. That is because the phosphor can show almost the same emission even if containing those elements in small amounts. However, in view of stability of the phosphor and reactivity in the manufacturing process thereof, their contents are preferably small. In addition, if those elements are intended to be incorporated into the phosphor, it may be necessary to change the synthesizing procedures. Accordingly, it is preferred not to use metal elements other than those in the formula (A) so as to save the production cost.

As a result of the applicant's experiments, it is found that a phosphor having a particular component, namely, a phosphor comprising potassium fluorosilicate activated by manganese has a property in which the external quantum efficiency is improved according as the half-band width of a diffraction pattern obtained by XRD measurement becomes narrower in a particular region.

The XRD measurement can be carried out, for example, by means of M18XHF22-SRA type micro area X-ray diffraction apparatus ([trademark], manufactured by Bruker AXS Inc.). The synthesized phosphor is subjected to the XRD measurement to obtain a diffraction pattern of the phosphor sample. The XRD measurement is conducted under such conditions that the diffraction pattern attributed of the Si standard powder (SRM 640c) of NIST (National Institute of Standards and Technology) may exhibit a half-band width of 0.13 or less. Those conditions are, for example, 40 KV, 100 mA, 0.002°-step and 0.01°/minute.

The phosphor of the embodiment is subjected to the XRD measurement to obtain a diffraction pattern, which is then compared with the PDF (powder diffraction file) database and thereby verified to correspond to #01-075-0694. In this way, the phosphor of the embodiment is assigned to $K_2SiF_6$. Figure shows diffraction patterns of PDF#01-075-0694 and a phosphor according to the embodiment. The patterns in FIG. 1 were measured in the range of 2θ=10° to 60°.

According to the PDF, there are intense diffraction patterns at 2θ=18.88°, 31.07°, 38.30° and 44.52°, which are attributed to (111), (220), (222) and (400) planes, respectively. Those values may slightly shift if other elements are added in small amounts or if the synthesizing conditions are changed.

The applicant has found that the narrower half-band width the above diffraction pattern attributed to each plane has, the higher the external quantum efficiency tends to be. Specifically, it is found that there is a strong correlation between the external quantum efficiency and the diffraction pattern attributed to (400). That diffraction pattern is observed in the range of 2θ=44 to 45°, preferably in the range of 2θ=44.42 to 44.62°, particularly at about 2θ=44.52° provided that the diffraction angle (2θ) is corrected on the basis of the Si standard powder (SRM 640c) of NIST in the measurement. In the pattern of PDF#01-075-0694, the corresponding diffraction pattern has a peak at 2θ=44.519°.

The "external quantum efficiency" here means a product value of the following absorptivity (α) and internal quantum efficiency (η'):

$$\text{absorptivity}(\alpha) = \frac{\int \lambda \cdot [E(\lambda) \cdot R(\lambda)] d\lambda}{\int \lambda \cdot [E(\lambda)] d\lambda} \qquad (I)$$

-continued $$\text{internal quantum efficiency}(\eta') = \frac{\int \lambda \cdot [P(\lambda)]d\lambda}{\int \lambda \cdot [E(\lambda) - R(\lambda)]d\lambda} \quad \text{(II)}$$

$$\text{external quantum efficiency}(\eta) = \frac{\int \lambda \cdot [P(\lambda)]d\lambda}{\int \lambda \cdot [E(\lambda)]d\lambda} \quad \text{(III)}$$

In the formulas, $E(\lambda)$: the whole spectrum of light emitted by the excitation light source onto the phosphor (in terms of the number of photons), $R(\lambda)$: the spectrum of light emitted by the excitation light source but reflected by the phosphor (in terms of the number of photons), and $P(\lambda)$: the emission spectrum of the phosphor (in terms of the number of photons).

As shown above, the external quantum efficiency can be obtained by (I)×(II).

The external quantum efficiency, internal quantum efficiency and absorptivity can be measured, for example, by means of C9920-02G absolute PL quantum yields measurement system ([trademark], manufactured by Hamamatsu Photonics K.K.). Those luminous characteristics can be measured by use of blue light having a peak in about 440 to 460 nm with a half-band width of 5 to 15 nm as the excitation light.

Figure 2:
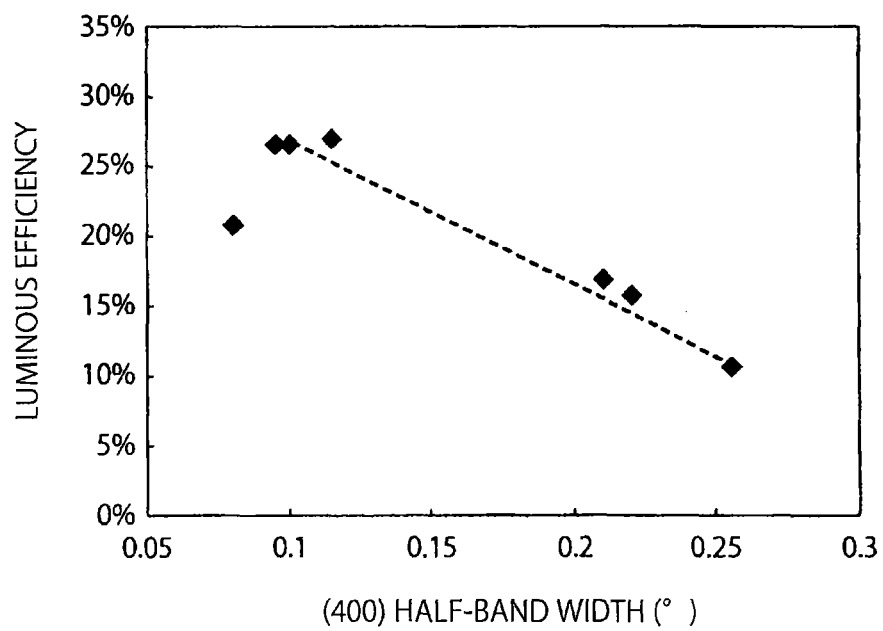
FIG. 2 shows a relation between the external quantum efficiency and the half-band width of a diffraction pattern attributed to the (400) plane of the phosphor according to the embodiment. The diffraction pattern was obtained by XRD measurement of the phosphor.

FIG. 2 shows a relation between the external quantum efficiency and the half-band width of a diffraction pattern attributed to the (400) plane. It can be confirmed from the figure that the narrower the diffraction pattern becomes, the more the external quantum efficiency is improved. The external quantum efficiency is found to be favorable when the diffraction pattern has a half-band width of 0.20° or less, preferably 0.15° or less. Although the figure does not show the lower limit of the half-band width, the quantum efficiency is thought to be good even if the half-band width is smaller than the measuring lower limit. Incidentally, the half-band width is obtained by the XRD measurement. For example, the measurement is carried out with the above apparatus under the above-described conditions to obtain a diffraction pattern, in which the half-band width is defined by the difference between the largest and smallest diffraction angles at which the intensity is half of the peak intensity of the diffraction pattern attributed to (400).

The above relation between the external quantum efficiency and the half-band width of XRD diffraction pattern is also found with respect to the diffraction pattern attributed to (222), which is observed in the range of $2\theta=37.7$ to $38.7°$, particularly at about $2\theta=38.3°$ provided that the diffraction angle ($2\theta$) is corrected on the basis of the Si standard powder (SRM 640c) of NIST in the measurement. In the pattern of PDF#01-075-0694, the corresponding diffraction pattern has a peak at $2\theta=38.301°$. Accordingly, in the obtained diffraction pattern, the diffraction pattern attributed to (400) or (222) preferably has a half-band width of 0.20° or less, preferably 0.15° or less.

The phosphor according to the embodiment can be manufactured, for example, in the following manner.

First, an aqueous solution containing potassium permanganate ($KMnO_4$) and hydrogen fluoride (HF) is prepared as a reaction solution, to which a silicon source capable of providing Si for the reaction system is then added. As the silicon source, various silicon-containing materials can be adopted. Examples of them include single crystal silicon, polycrystal silicon, amorphous silicon, crystalline silicon dioxide and amorphous silicon dioxide.

After the silicon source is placed in the reaction solution, the solution is left for a particular time to react so that the aimed phosphor is formed on the surface of the silicon source. There are no particular restrictions on the shape of the silicon source, but the silicon source is preferably not in the shape of fine powder because it is necessary to separate the phosphor formed on the surface from the silicon source as described below. Specifically, in order to isolate the phosphor from the silicon source, the volume of the silicon source is preferably larger than that of the phosphor. For example, the silicon source may be in the form of particles, plates or rods of 20000 times as large in volume as the phosphor. If the silicon source is very different in volume from the phosphor, it becomes possible to physically scrape off the phosphor crystal from the source surface or otherwise to separate and collect the phosphor crystal by use of a sieve after the phosphor crystal is peeled off from the silicon source by means of an ultrasonic vibrator. The silicon source is, for example, a silicon substrate such as a silicon wafer, granular amorphous silicon, or a silicon dioxide film formed on the surface of a silicon substrate.

The reaction solution contains $KMnO_4$ and HF preferably in a molar ratio of 1/200 to 1/40, and the concentration of $KMnO_4$ is preferably 1 wt % or more. If they deviate from those ranges, the synthesized phosphor may exhibit poor external quantum efficiency and/or the reactivity may be so lowered that the phosphor cannot be synthesized in a sufficient amount and accordingly that the production cost may increase. There are no particular restrictions on the reaction temperature, but the reaction is preferably conducted at a high temperature because the reaction efficiency tends to be improved at a high temperature. On the other hand, however, in view of the production cost, it is preferred not to increase the temperature too much. Accordingly, the reaction is carried out preferably at a temperature of 80° C. or below.

The above manufacturing method thus makes it possible to synthesize a phosphor of high luminous efficacy according to the embodiment.

The phosphor of the embodiment is characterized in that the diffraction angle attributed to (400) has a half-band width of 0.20° or less, and therefore can achieve high external quantum efficiency. The reason of that is presumed to be as follows.

The phosphor according to the embodiment is mainly in the form of nearly cubic particles. That is thought to be because the crystal structure of $K_2SiF_6$ belongs to Fm-3m space group in the cubic crystal system. Specifically, the crystal axes in $K_2SiF_6$ are equal to each other and all the angles among them are 90°, and accordingly the particles thereof are almost in the form of cubes.

The phosphor has the above crystal structure and shows an XRD diffraction pattern having a narrow half-band width, and this indicates that the planes in the corresponding plane direction are regularly arranged at even intervals.

In other words, in the $K_2SiF_6$ crystal structure of the phosphor according to the embodiment, atoms in the (400) are regularly arranged in each edge direction to form a homogeneous structure. That is presumed to be the reason of exhibiting excellent external quantum efficiency.

In the method for manufacturing the phosphor according to the embodiment, the reaction time is restricted. This means that the phosphor produced in a particular reaction time has favorable properties. This relation between the reaction time and the phosphor properties is presumed to be as follows.

The phosphor is formed on the surface of the silicon source in the manufacturing method according to the embodiment. The formed phosphor crystal then grows according as the reaction proceeds. When expanding to a certain size, the phosphor crystal finally spontaneously peels off from the silicon source into the solution and precipitates on the bottom of the vessel. Consequently, there are two kinds of the formed phosphor: that is, one is the phosphor attached on the silicon source surface and the other is that accumulated in the solution. The reaction solution is removed from the reaction mixture, and the residue is washed and dried to isolate the phosphor accumulated in the solution. On the other hand, the phosphor remaining attached on the silicon source surface is physically scraped from the silicon source, then washed and dried to isolate. However, according to the applicant's study, the phosphor produced in this manner is relatively weak against physical shock. Specifically, it is confirmed that, if physical shock is applied to the phosphor, for example, if the phosphor is scraped from the silicon source or if the phosphor in the form of large particles is pulverized into small particles, the luminous properties are seriously damaged. In fact, in the case where the phosphor in the form of large particles was pulverized, the luminous properties and the quantum efficiency showed the relations of Table 1 to the half-band widths of the diffraction patterns obtained by the XRD measurement. In the table, the values of absorptivity, internal and external quantum efficiencies are relative values provided that those before the pulverization are regarded as 100%.

TABLE 1

| Pulverization | FWHM of XRD line (°) | | Absorptivity | Internal quantum efficiency | External quantum efficiency |
| --- | --- | --- | --- | --- | --- |
| | (222) | (400) | | | |
| Before | 0.129 | 0.157 | 100% | 100% | 100% |
| After | 0.213 | 0.271 | 72% | 67% | 48% |

If the reaction time is too short in the manufacturing method of the embodiment, the formed phosphor particles cannot grow sufficiently and hence a large amount of the phosphor remains attached on the silicon source. Accordingly, scraping procedure is necessary to collect the phosphor but the luminous efficacy is thought to be impaired by the physical stress. Further, if the reaction time is too short, the yield of the collected phosphor may be lowered. In view of those, the reaction time is preferably 20 minutes or more in the manufacturing method according to the embodiment.

On the other hand, if the reaction time is long, the yield is improved and the amount of the phosphor precipitated in the reaction solution tends to increase. At same time, however, the phosphor particles grow so that the mean particle size tends to extend. The phosphor in the form of too large particles needs to be pulverized or crashed, but the luminous efficacy may be impaired by physical shock applied in the pulverization. Accordingly, in the manufacturing method of the embodiment, the reaction time is necessarily 80 minutes or less, preferably 70 minutes or less. As for the reaction temperature, the phosphor can be synthesized at a temperature of 10 to 70° C. although produced at 20° C. in Examples described later. The optimal reaction time depends on the reaction temperature and the shape of the silicon source. However, the higher the reaction temperature is and the larger surface area the silicon source has, the shorter the optimal reaction time tends to be.

There are no particular restrictions on the size of the crystal particles of the phosphor according to the embodiment. If the phosphor is intended to use for a coating in a light-emitting device, the mean particle size is preferably 1 to 50 µm, more preferably 5 to 40 µm, further preferably 5 to 30 µm. The mean particle size can be determined by means of a particle size distribution analyzer, such as, Microtrac MT3300 EXII ([trademark], manufactured by NIKKISO Co., Ltd.). If the particle size is too small, the luminous properties of the phosphor may be impaired. On the other hand, however, if the particle size is too large, the phosphor may clog a nozzle of coating machine when the coating is formed in the light-emitting device and/or the resultant light-emitting device may exhibit light of uneven color. Those should be paid attention to. In order to adjust the mean particle size of the phosphor within a preferred range, the phosphor needs to be pulverized in a mortar or the like. However, as described above, the luminous properties may be damaged by physical shock and therefore that is not preferred.

In the manufacturing method of the embodiment, the phosphor crystal grows in the reaction solution. However, the phosphor of the embodiment is not absolutely insoluble in water and accordingly the elements in the crystal are presumed to be partly replaced with those in the reaction solution to form a favorable crystal structure.

The phosphor particles precipitated in the reaction solution can be washed with pure water and the like. The reaction solution, which contains $KMnO_4$, is colored in dark purple, and hence needs to be sufficiently washed away to remove.

The phosphor particles thus manufactured may be subjected to coating treatment to form a surface layer on the surface thereof so as to, for example, protest the phosphor from moisture or to improve coatability in producing the device. Material of the surface layer can be selected from silicone resin, epoxy resin, fluororesin, tetraethoxysilane (TEOS), silica, zinc silicate, aluminum silicate, calcium polyphosphate, silicone oil or silicon grease. The zinc silicate and aluminum silicate are represented by, for example, $ZnO \cdot cSiO_2$ ($1 \leq c \leq 4$) and $Al_2O_3 \cdot dSiO_2$ ($1 \leq d \leq 10$), respectively. The surface of the phosphor particles does not need to be completely coated with the surface layer, and may be partly bared. As long as provided on a part of the phosphor surface, the surface layer of the above material can take effect even if the whole surface is not completely covered. The surface layer can be provided by immersing the phosphor particles in a dispersion or solution of the material and then drying them by heating or the like. In order to obtain the effect of the surface layer without damaging the essential function of the phosphor, the amount of the surface layer is preferably 0.1 to 5 vol % based on the phosphor particles.

The particles of the phosphor according to the embodiment may be sieved according to the coating method adopted for producing the light-emitting device. When the particle size is controlled with a sieve, the phosphor particles less undergo physical stress and hence the luminous properties thereof are less damaged. For producing a common white LED device, which adopts excitation light having an emission peak in the blue region, it is generally preferred to use the phosphor particles sieved to have a mean particle size of 1 to 50 µm. If the phosphor particles are sieved to be too small, the emission intensity may be lowered. On the other hand, if sieved to be too large, they may clog a nozzle of coating machine when the coating is formed on the LED device, so that the operational efficiency and production yield may be lowered and/or so that the resultant light-emitting device may exhibit light of uneven color.

The phosphor according to the embodiment of the present disclosure can be combined with a light-emitting element having an emission peak in the blue region, to obtain an LED light-emitting device of the embodiment. The LED light-emitting device according to the embodiment exhibits larger emission intensity than conventional devices employing $K_2SiF_6$:Mn red-light emitting phosphors.

Figure 3:
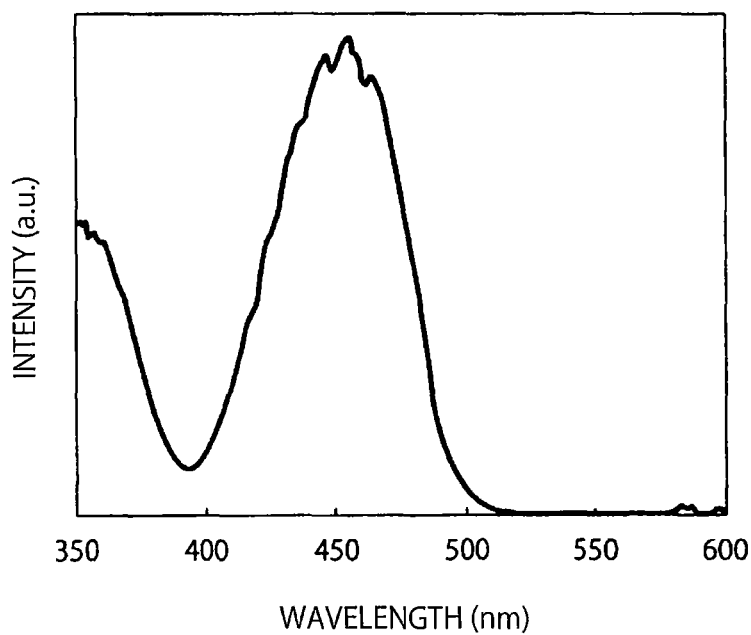
FIG. 3 shows an excitation spectrum of a phosphor according to another embodiment.

The phosphor of the embodiment can be excited by an excitation light source showing an emission peak in the blue to UV region. When the phosphor is used in the light-emitting device, the excitation light source is preferably a light-emitting element having an emission peak in the wavelength range of 440 to 470 nm inclusive. That is evident from FIG. 3, which is the excitation spectrum of the phosphor according to the embodiment. In view of the luminous efficacy, it is not preferred to use light-emitting elements having emission peaks out of the above range. Examples of the light-emitting element include solid-state light source elements such as LED chips and laser diodes.

The phosphor of the embodiment emits red luminescence, and therefore can be combined with green- or yellow-light emitting phosphors to obtain a white light-emitting device. What phosphors to use can be freely selected according to the purpose of the light-emitting device. For example, in the case of producing a white light-emitting device having a low color temperature, the phosphor of the embodiment is combined with a yellow-light emitting phosphor to obtain a device excellent in both efficacy and color rendering properties.

Green- or yellow-light emitting phosphors can be said to be phosphors having main emission peaks in the wavelength range of 520 to 570 nm inclusive. Examples of those phosphors include: silicate phosphors, such as, $(Sr,Ca,Ba)_2SiO_4$:Eu and $Ca_3(Sc,Mg)_2Si_3O_{12}$:Ce; sulfide phosphors, such as, $(Y,Gd)_3(Al,Ga)_5O_{12}$:Ce and $(Ca,Sr,Ba)Ga_2S_4$:Eu; and alkaline earth oxynitride phosphors, such as, $(Ca,Sr,Ba)Si_2O_2N_2$:Eu and $(Ca,Sr)$-αSiAlON. Here, the "main emission peaks" means the wavelengths at which the phosphors exhibit the largest emission intensities in their emission spectra. The emission peaks of the exemplified phosphors have been already reported in various references and the like. The emission peaks are often shifted within about 10 nm by small amounts of additive elements used in producing the phosphors or by slight fluctuation of the composition, but even the phosphors showing those shifted emission peaks are also included in the above exemplified phosphors.

According to the purpose, the light-emitting device employing the phosphor of the embodiment may further comprise blue green-, orange- and/or red-light emitting phosphors other than the above.

Examples of the orange- and red-light emitting phosphors include: silicate phosphors, such as, $(Sr,Ca,Ba)_2SiO_4$:Eu; tungstate phosphors, such as, $Li(Eu,Sm)W_2O_8$; oxysulfide phosphors, such as, $(La,Gd,Y)_2O_2S$:Eu; sulfide phosphors, such as, $(Ca,Sr,Ba)S$:Eu; and nitride phosphors, such as, $(Sr,Ba,Ca)_2Si_5N_8$:Eu and $(Sr,Ca)AlSiN_3$:Eu. Those can be employed in combination with the phosphor of the embodiment so as to manage not only the efficacy but also the color rendering properties for illumination use and the color gamut for backlight use.

Figure 4:
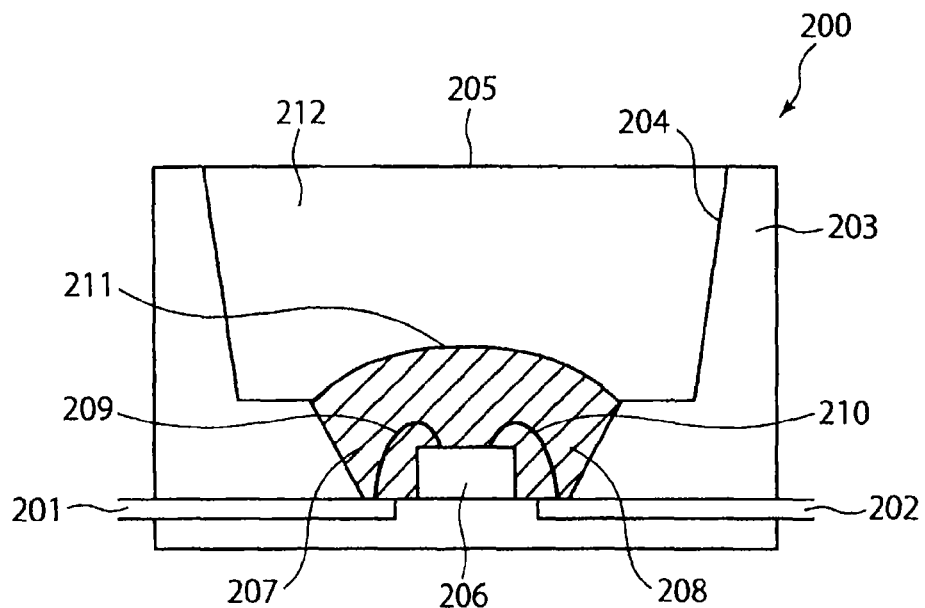
FIG. 4 shows a schematic sectional view of a light-emitting device according to an embodiment.

FIG. 4 shows a schematic sectional view of a light-emitting device of the embodiment.

In the shown device, a resin stem 200 comprises leads 201 and 202, which are formed as a part of a lead frame, and also comprises a resin member 203, which is formed by integral molding with the lead frame. The resin member 203 has a concavity 205 in which the top opening is larger than the bottom. The inside wall of the concavity is coated with a reflective surface 204.

At the center of the nearly circular bottom of the concavity 205, there is a light-emitting chip 206 mounted with Ag paste or the like. The light-emitting chip 206 radiates, for example, UV or visible emission. Examples of the light-emitting chip 206 include GaAs type and GaN type semiconductor light-emitting diodes. The electrodes (not shown) of the light-emitting chip 206 are connected to the leads 201 and 202 by way of bonding wires 209 and 210 made of Au or the like, respectively. The positions of the leads 201 and 202 can be adequately modified.

In the concavity 205 of the resin member 203, there is a phosphor layer 207. In the phosphor layer 207, the phosphor 208 according to the embodiment is dispersed in a resin layer 211 made of, for example, silicone resin in an amount of 5 to 50 wt % inclusive. The phosphor can be fixed with various binders, such as, organic resin materials and inorganic glass materials.

The organic binder materials are preferably highly light-resistant transparent resins, such as, epoxy resin and acrylic resin as well as the silicone resin described above. The inorganic binder materials are preferably, for example, low melting point glass or the like made with alkaline earth borate; silica or alumina in the form of such fine particles that large particles of the phosphor can be fixed; and alkaline earth phosphate or the like obtained by sedimentation. Those binders can be used singly or in combination with two or more.

The phosphors used in the phosphor layer may be subjected to surface-coating treatment, if necessary. The surface coating prevents the phosphors from deterioration caused by external factors, such as, heat, humidity and UV. Further, the treatment makes it possible to manage the dispersability of the phosphors so that the phosphor layer can be easily designed.

The light-emitting chip 206 may be of a flip chip type in which the n- and p-electrodes are placed on the same plane. This element can avoid troubles concerning the wires, such as disconnection or dislocation of the wires and light-absorption by the wires. In that case, therefore, it is possible to obtain a semiconductor light-emitting device excellent both in reliability and in luminance. Further, it is also possible to adopt a light-emitting chip 206 having an n-type substrate so as to produce a light-emitting device constituted as described below. In that device, an n-electrode is formed on the back surface of the n-type substrate while a p-electrode is formed on the top surface of a semiconductor layer laid on the substrate. The n- or p-electrode is mounted on one of the leads, and the p- or n-electrode is connected to the other lead by way of a wire, respectively. The size and kind of the light-emitting chip 206 and the dimension and shape of the concavity 205 can be properly changed.

Figure 5:
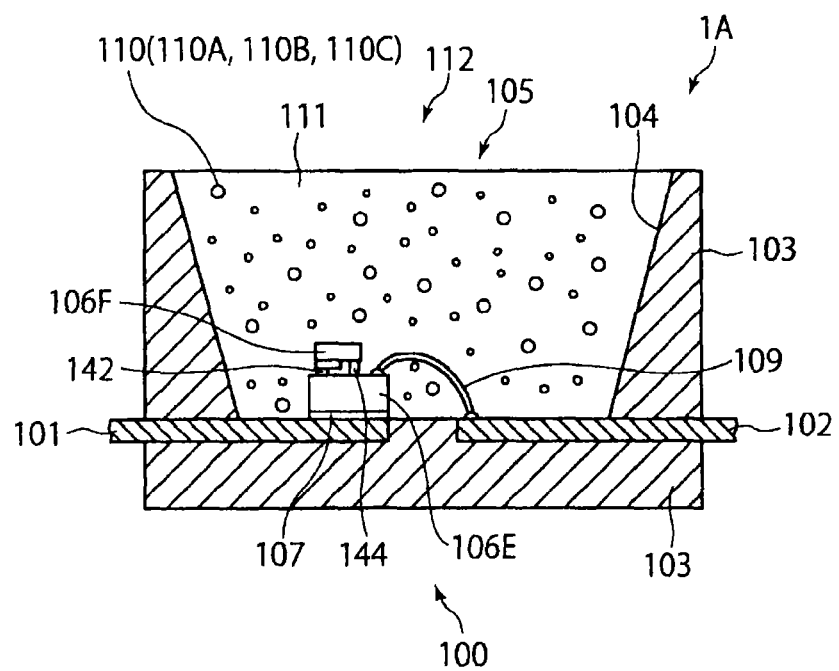
FIG. 5 shows a schematic sectional view of a light-emitting device according to another embodiment.

FIG. 5 shows a vertical sectional view schematically illustrating a light-emitting device according to another embodiment of the present disclosure. The shown device comprise a resin stem 100, a semi-conductor light-emitting element 106F mounted thereon, and a sealant 111 covering the light-emitting element 106F. The sealed resin stem 100 comprises leads 101 and 102, which are formed as a part of a lead frame, and also comprises a resin member 103, which is formed by integral molding with the lead frame. The leads 101 and 102 are so placed that the inner ends of them are faced closely to each other. On the other hand, the outer ends of the leads 101 and 102 are oppositely extended to outside of the resin member 103.

The resin member 103 has a concavity 105. On the bottom of the concavity, there is a protective Zener diode 106E mounted with an adhesive 107. There is a semi-conductor light-emitting element 106F on the protective Zener diode 106E. Accordingly, the diode 106E is mounted on the lead 101, and is connected to the lead 102 by way of a wire 109.

The semi-conductor light-emitting element 106F is surrounded by the inside wall of the resin member 103, and the inside wall is inclined to the light-extraction direction and serves as a reflective surface 104, which reflects light. The concavity 105 is filled with the sealant 111, which contains a phosphor 110. The light-emitting element 106F is placed on the protective Zener diode 106E. The phosphor of the embodiment is adopted as the phosphor 110.

Figure 6:
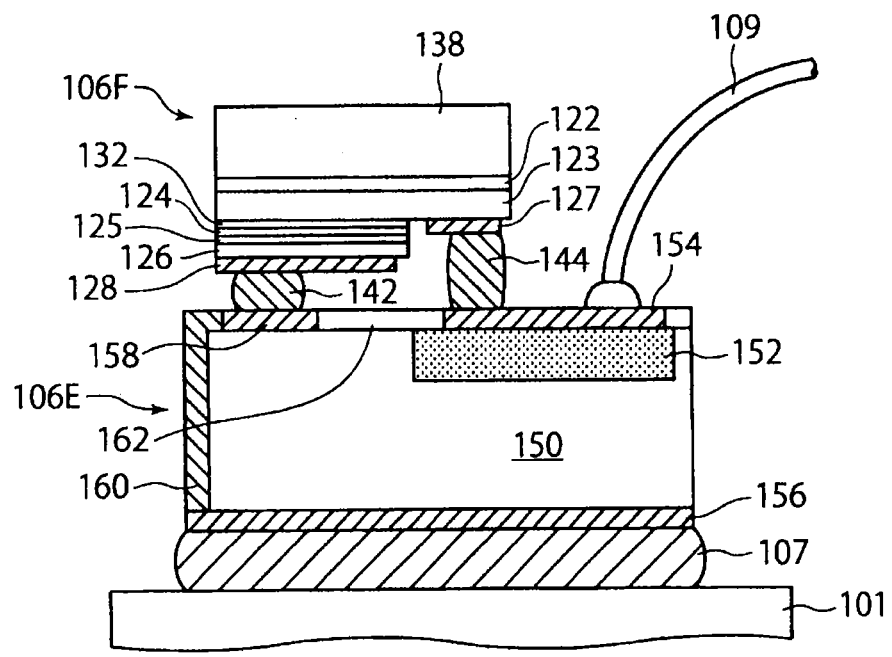
FIG. 6 shows an enlarged view of a light-emitting element.

The following will describe in detail the part around the chip of the light-emitting device. As shown in FIG. 6, the protective diode 106E has a planar structure comprising an n-type silicon substrate 150 and a p-type area 152 formed thereon. There is a p-electrode 154 formed in the p-type area 152 while there is an n-electrode 156 formed on the bottom of the substrate 150. Further, there is also another n-electrode 158 formed on the top of the diode 106E on the opposite side to the n-electrode 156. Those two n-electrodes 156 and 158 are connected by way of a wiring layer 160 provided on the side surface of the diode 106E. Furthermore, there is a high-reflective film 162 formed on the surface of the diode 106E, where the p- and n-electrodes 154, 158 are provided. The high-reflective film 162 has high reflectance to light emitted from the light-emitting element 106F.

The semi-conductor light-emitting element 106F comprises a buffer layer 122, an n-type contact layer 123, an n-type clad layer 132, an active layer 124, a p-type clad layer 125 and a p-type contact layer 126, which are stacked in this order on a transparent substrate 138. Further, there are n- and p-electrodes 127, 128 formed on the n-type and p-type contact layers 123, 126, respectively. Light emitted from the active layer 124 is extracted though the transparent substrate 138.

The light-emitting element 106F having the above structure is flip-chip-mounted on the diode 106E with bumps. Specifically, the p-electrode 128 of the light-emitting element 106F is electrically connected to the n-electrode 158 of the diode 106E by way of a bump 142. On the other hand, the n-electrode 127 of the element 106F is electrically connected to the p-electrode 154 of the diode 106E by way of a bump 144. The p-electrode 154 of the diode 106E is bonded to the wire 109, which is connected to the lead 102.

Figure 7:
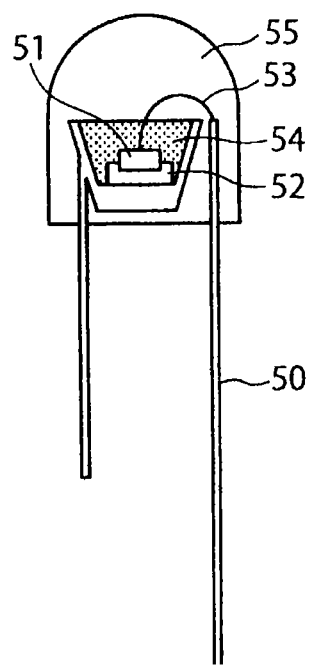
FIG. 7 shows a schematic sectional view of a light-emitting device according to still another embodiment.

FIG. 7 shows a schematic sectional view of a shell-type light-emitting device, in which a semi-conductor light-emitting element 51 is mounted on a lead 50' with a mount member 52 and covered with a predip material 54. The light-emitting element 51 is connected to a lead 50 by way of a wire 53, and is sealed with a casting material 55. The phosphor of the embodiment is contained in the predip material 54. The light-emitting device, such as a white LED device, according the embodiment is suitably used for general illumination as described above, but is also favorably used in combination with filters such as color filters to serve as a lighting element such as a light source for backlighting of liquid crystal displays. Specifically, it can be adopted as an LED backlight light source or as a red-light emitting element employed in an inorganic electroluminescence device comprising a blue-light emitting layer.

The embodiments of the present disclosure will be further explained in detail by Examples and Comparative examples described below, but are by no means limited to the following Examples unless deviating from the scope and spirit of the disclosure.

EXAMPLES

Example 1

As a starting material, a commercially available Si single crystal was prepared. Independently, 10.8 g of $KMnO_4$ powder and 200 ml of an aqueous solution of HF (49 wt %) were sufficiently mixed in 200 ml of a mixed solution, to prepare a reaction solution. In the reaction solution, the Si single crystal was made to react at room temperature (20° C.) for 80 minutes while the reaction solution was stirred slowly enough to be homogeneous. As a result, a phosphor was formed on the surface of the Si single crystal. The phosphor gradually grew to be large particles, which then spontaneously peeled off from the Si single crystal surface without undergoing any physical stress and finally accumulated on the bottom of the vessel. The obtained phosphor was subjected to quantitative analysis and thereby found to have a composition of $K_{2.1}(Si_{0.98}Mn_{0.02})F_{5.8}$. Further, the XRD measurement was carried out to obtain a diffraction pattern, from which the crystal structure was assigned to $K_2SiF_6$.

The procedure of Example 1 was repeated except for changing the reaction time to 10 minutes, to produce a phosphor of Comparative example 1. The produced phosphor was subjected to the XRD measurement to obtain a diffraction pattern, from which the crystal structure was also assigned to $K_2SiF_6$.

With respect to the half-band width of a diffraction peak attributed to (400) plane determined by the XRD measurement, the phosphor of Example 1 was compared with that of Comparative example 1. As a result, the half-band width in Example 1 was 0.10 while that in Comparative example 1 was 0.25. Further, with respect to the external quantum efficiency, the phosphor of Example 1 was also compared with that of Comparative example 1. As a result, the external quantum efficiency in Example 1 was so improved as to be 2.45 times as large as that in Comparative example 1.

The procedure of Example 1 was further repeated except for changing the reaction time and/or the composition to those shown in Table 2, to obtain phosphors of Example 2 to 5. As for each phosphor, Table 2 shows the half-band width of a diffraction peak attributed to (400) plane and (222) plane and the relative external quantum efficiency based on that of Comparative example 1, as well as the reaction time in the synthesis.

It is evident from Table 1 that the phosphor of the embodiment is improved in the efficacy as compared with that of Comparative example 1.

TABLE 2

|  | Reaction time (min.) | XRD FWHM (400) plane | Relative quantum efficiency | Composition of phosphor |
| --- | --- | --- | --- | --- |
| Com. 1 | 10 | 0.25 | 1.00 | $K_2SiF_6$:Mn |
| Ex. 1 | 80 | 0.10 | 2.45 | $K_2SiF_6$:Mn |
| Ex. 2 | 20 | 0.20 | 1.57 | $K_2SiF_6$:Mn |
| Ex. 3 | 40 | 0.12 | 2.45 | $K_2SiF_6$:Mn |
| Ex. 4 | 60 | 0.10 | 2.45 | $K_2SiF_6$:Mn |
| Ex. 5 | 20 | 0.19 | 1.15 | $K_2(Si,Ti)F_6$:Mn |

The phosphor of Example 1 was combined with an LED chip showing a peak wavelength at 450 nm and a $Y_3Al_5O_{12}$:Ce phosphor showing a peak wavelength at 555 nm with a half-band width of 105 nm, to produce a white LED light-emitting device. The produced device was confirmed to be improved in the white color efficacy as compared with a white LED device employing the phosphor of Comparative example 1.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the invention.

The invention claimed is:

1. A phosphor represented by the formula (A):

$$K_a(Si_{1-x-y},Ti_x,Mn_y)F_b \quad (A)$$

in which a, b, x and y are numbers satisfying the conditions of
1.8≤a≤2.2,
5.2≤b≤6.3,
0≤x≤0.3, and
0.01<y≤0.05;
wherein a half-band width of a diffraction pattern attributed to the (400) plane is not more than 0.2° determined by X-ray powder diffractometry and the external quantum efficiency of said phosphor is not less than 15%.

2. The phosphor according to claim 1, wherein the half-band width of a diffraction pattern attributed to the (222) plane is not more than 0.2° determined by X-ray powder diffractometry.

3. The phosphor according to claim 1, which is in the form of particles having a mean particle size of 1 to 50 μm.

4. The phosphor according to claim 1, wherein the oxygen and fluorine contents satisfy the condition of:

[oxygen content]/[(fluorine content)±(oxygen content)]<0.05.

5. The phosphor according to claim 1, wherein said external quantum efficiency of said phosphor is not less than 20%.

6. A method for manufacturing the phosphor according to claim 1, comprising:
preparing an aqueous solution as a reaction solution comprising potassium permanganate and hydrogen fluoride,
immersing a silicon source in said reaction solution,
reacting them for 20 to 80 minutes, and
peeling off a formed phosphor crystal spontaneously from the silicon source.

7. The method according to claim 6, wherein said silicon source is selected from the group consisting of single crystal silicon, polycrystal silicon, and amorphous silicon.

8. The method according to claim 6, wherein said silicon source is a silicon substrate.

9. The method according to claim 6, wherein said reaction solution comprises potassium permanganate and hydrogen fluoride in a molar ratio of 1:200 to 1:40.

10. The method according to claim 6, wherein said reaction solution contains potassium permanganate in an amount of 1 wt % or more.

11. A light-emitting device comprising
a light-emitting element radiating light in the wavelength range of 440 to 470 nm inclusive, and
a phosphor layer comprising the phosphor according to claim 1.

12. The light-emitting device according to claim 11, wherein said phosphor layer further comprises a green- or yellow-light emitting phosphor.

13. The light-emitting device according to claim 12, wherein said green- or yellow-light emitting phosphor is selected from the group consisting of $(Sr,Ca,Ba)_2SiO_4$:Eu, $Ca_3(Sc,Mg)_2Si_3O_{12}$:Ce, $(Y,Gd)_3(Al,Ga)_5O_{12}$:Ce, $(Ca,Sr,Ba)Ga_2S_4$:Eu, $(Ca,Sr,Ba)Si_2O_2N_2$:Eu and $(Ca,Sr)$-αSiAlON.

14. The light-emitting device according to claim 11, wherein said phosphor layer furthermore contains an orange- or red-light emitting phosphor.

15. The light-emitting device according claim 14, wherein said orange- or red-light emitting phosphor is selected from the group consisting of $(Sr,Ca,Ba)_2SiO_4$:Eu, $Li(Eu,Sm)W_2O_8$, $(La,Gd,Y)_2O_2S$:Eu, $(Ca,Sr,Ba)S$:Eu, $(Sr,Ba,Ca)_2Si_5N_8$:Eu, and $(Sr,Ca)AlSiN_3$:Eu.

16. The phosphor according to claim 1, which is made by a method comprising:
preparing an aqueous solution as a reaction solution comprising potassium permanganate and hydrogen fluoride,
immersing a silicon source in said reaction solution,
reacting them for 20 to 80 minutes, and
peeling off a formed phosphor crystal spontaneously from the silicone source.

* * * * *